United States Patent [19]

Swikle et al.

[11] Patent Number: 5,239,127
[45] Date of Patent: Aug. 24, 1993

[54] ELECTRICAL INTERCONNECT APPARATUS

[75] Inventors: Todd G. Swikle, Downers Grove; Mark A. Barabolak, Elmhurst, both of Ill.

[73] Assignee: Motorola Inc., Schaumburg, Ill.

[21] Appl. No.: 695,080

[22] Filed: May 3, 1991

[51] Int. Cl.$^5$ .............................................. H05K 9/00
[52] U.S. Cl. ................................ 174/35 R; 361/761; 361/777; 361/816; 361/96
[58] Field of Search .......... 174/35 R, 35 GC, 35 MS; 361/424, 399, 415, 392, 395, 400, 401, 404, 405, 406, 409; 219/10.55 R, 10.55 D

[56] References Cited

U.S. PATENT DOCUMENTS

| | | | |
|---|---|---|---|
| 4,831,498 | 5/1989 | Baba | 361/424 |
| 4,890,199 | 12/1989 | Beutler | 361/424 |
| 5,043,528 | 8/1991 | Mohr | 174/35 GC |
| 5,053,924 | 10/1991 | Kurgan | 361/424 |
| 5,053,926 | 10/1991 | Dickie | 361/424 |
| 5,124,889 | 6/1992 | Humbert et al. | 361/424 |

OTHER PUBLICATIONS

Instruction Manual 68P81054E60-0 for a DYNA TAC Cellular Portable Telephone, G-S series. manufactured by Motorola, Inc., Jul. 30, 1988.

Primary Examiner—Leo P. Picard
Assistant Examiner—Bot L. Ledynh
Attorney, Agent, or Firm—Kevin D. Kaschke

[57] ABSTRACT

An apparatus provides an electrical connection (113) between an RF shield (109) and a printed circuit board (115) in a radio communication device (100). A spring member (211), having a free end (209), extends laterally from the RF shield (109). The free end (209) includes an edge (317) formed by the angular displacement of a triangular portion (315) from a bottom surface (307) of the free end (209). The flexible nature of the spring member (211), under load, drives the free end (209) into the printed circuit board (115) such that the edge (317) is imbedded into solder (205) disposed on a conductive circuit (207) on the printed circuit board (115).

9 Claims, 2 Drawing Sheets

ELECTRICAL INTERCONNECT APPARATUS

FIELD OF THE INVENTION

The present invention relates generally to radio frequency (RF) shielding within a radio communication device and, more particularly, to an apparatus for providing a ground connection between an RF shield and a printed circuit board contact for effecting RF shielding of an RF emitting device.

BACKGROUND OF THE INVENTION

Modern day radio communication devices are being continually designed and manufactured with greater reliability yet lower manufacturing costs and simplified assembly. With a continuing demand for better capabilities and additional service features the circuitry has become ever increasingly complex and more dense when arranged on associated circuit boards or the like.

The expected increase in operating efficiencies and new or additional service features have been, for the most part, achieved on a reasonably broad front. However, this does not mean that operating parameters or requirements have simply been ignored or somehow has, or can be designed away.

In RF circuitry, for example, shielding is still a necessity which requires appropriate connection of such shield and adequate circuit ground. A shield of an appropriate conductive material must somehow be fastened to a conductive ground circuit on the printed circuitry board yet be readily removable for serving of the RF circuitry, being so shielded, if the need so arises.

A conventional approach providing a ground connection between a metallic RF shield and the conductive ground circuit on the printed circuit board is to simply solder an edge of the shield to the conductive circuit. Certain applications requiring a grounded RF shield, advantageously utilizing a reflow solder process (i.e. solder on a printed circuit board contact is heated as the board moves through an infrared oven), may easily achieve a soldered electrical connection. However, the placement of some RF shields to the conductive circuit. The manual soldering process is expensive, time consuming and subject to reliability problems.

Another conventional approach of effecting RF shielding utilizing a ground connection employs a spring member, extending laterally from the RF shield, of the RF shield having a dimple imbedded into a free end of the spring member. When the free end of the spring member is forced against the conductive circuit a curved portion of the dimple contacts the conducive circuit forming the ground connection. This ground connection may be utilized for certain RF shielding applications but is not as reliable as the manual soldered or reflow soldered ground connections.

Consequently, there is a need for a ground connection between the RF shield and the printed circuit board which yields a reliable connection without relying on manual soldering or reflow soldering processes.

SUMMARY OF THE INVENTION

These needs and others are met with an electromagnetic shielding apparatus for an electronic component. A substrate includes deformable electrically conductive means having a surface. A shielding surface covers at least a portion of the component. The shielding surface formed thereby being comprised of an electrically conductive, electromagnetic wave-absorbing material for absorbing electromagnetic energy radiated by or towards the component. An electrically conductive contact provides a protrusion with an edge. An electrically conductive spring member couples the contact and the shielding surface, and biases the contact towards the substrate permitting the edge of the protrusion to extend substantially beyond the surface of the deformable electrically conductive means causing at least partial displacement thereof and electrical connection therebetween.

DETAILED DESCRIPTION OF THE PREFERRED EMBODIMENT

Figure 1:
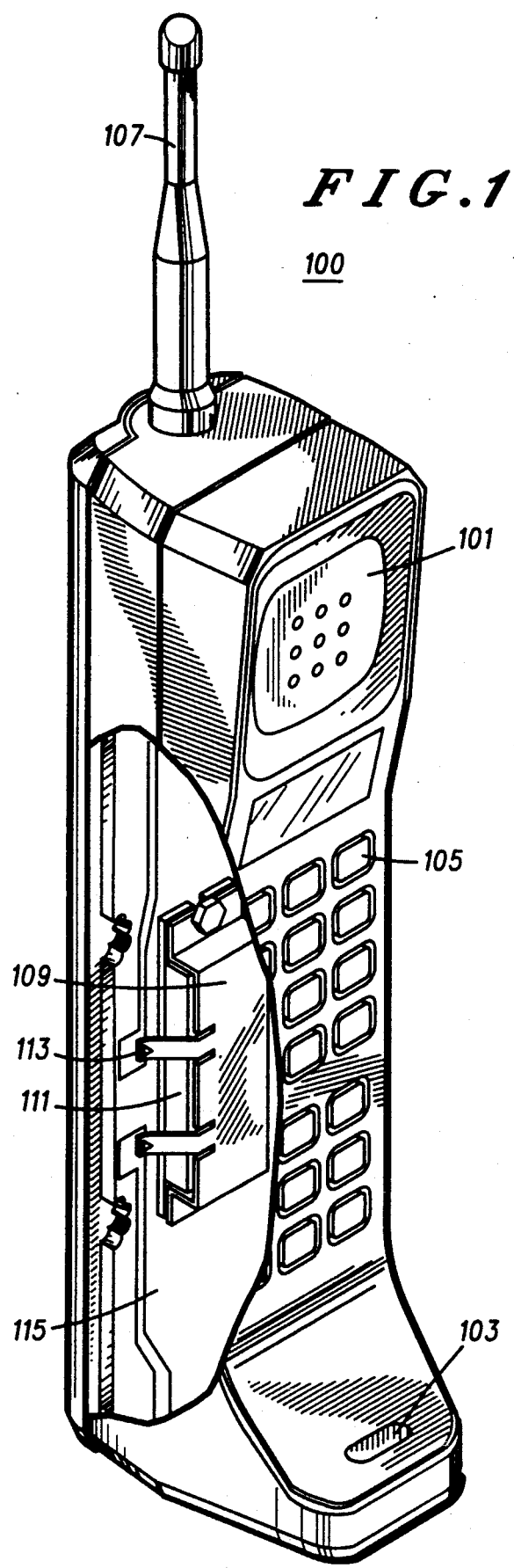
FIG. 1 illustrates a perspective cut-away view of a radio communication device exposing an RF shield connected to a printed circuit board for effecting RF shielding of an internal RF emitting device.

Referring now to the drawings, there is shown in FIG. 1, a portable radio telephone unit 100 adapted for use in a radiotelephone system. A user of the portable unit may listen via earpiece 101 and may speak into a microphone 103. The keypad 105 consists of a plurality of buttons numbered 1 through 0, # and *, in a familiar telephone arrangement. The keypad 105 may also have additional functional buttons such as volume control and other buttons associated with telephone number recall. An antenna 107 enables wireless communication between the portable unit 100 and a remote base site.

A cut-way view of FIG. 1 shows an RF shield 109 effecting RF shielding for an RF emitting device 111 advantageously utilizing an effective ground connection 113 between the RF shield 109 and a printed circuit board 115.

Figure 2:
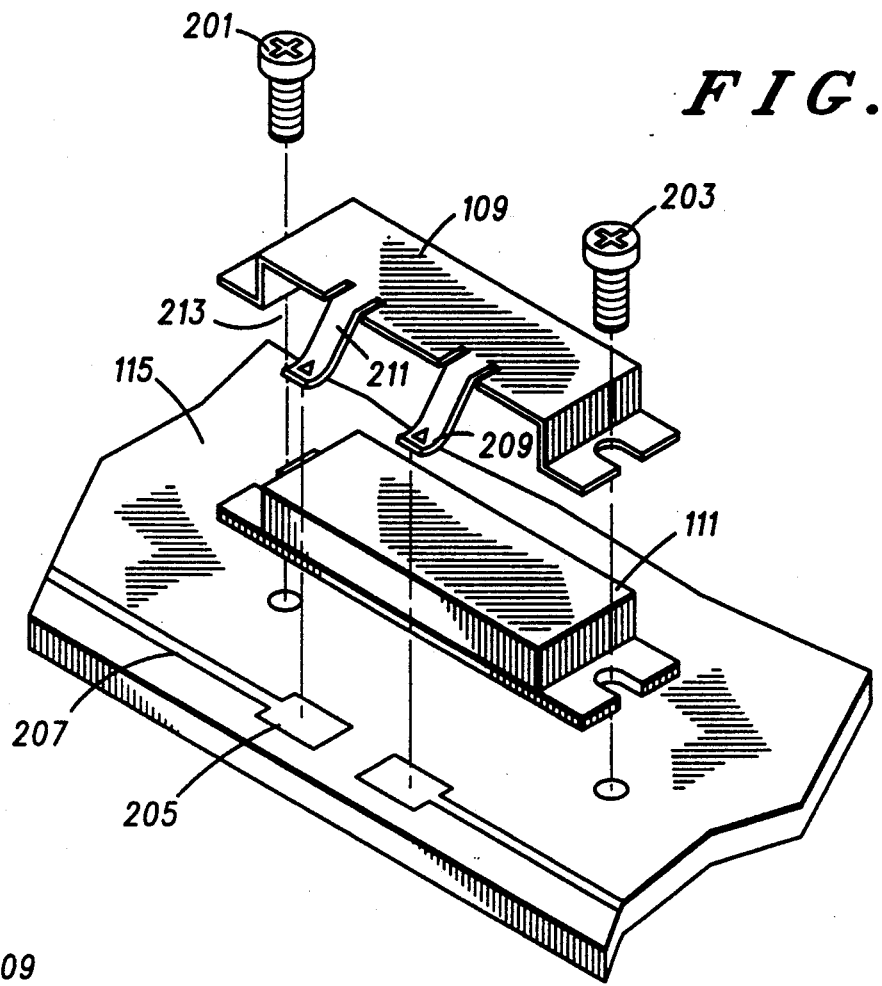
FIG. 2 is an exploded perspective view of the cut-away perspective view of FIG. 1.

The cut-away view of FIG. 1 is shown in an exploded perspective detail in FIG. 2. The printed circuit board 115 is fabricated of a non-conductive material such as fiberglass, which is plated with various conductive circuits and connection pads as well as associated component elements mounted thereon, which when incorporation, provide the desired transmitting/receiving functions for the controlling users/operator.

The RF emitting device 111, such as an RF power amplifier, is intended for containment in the RF shield 109. Screws 201 and 203, threaded into a grounding plate beneath the printed circuit board 115, secure the RF shield 109 and the RF emitting device 111 to the printed circuit board 115.

A significant aspect of the present invention is the provision for providing a renewable and reliable ground connection between the RF shield 109 and the printed circuit board 115. The advantage of this ground connection over the aforementioned conventional grounding approaches is that the solder is not heated and yet a reliable connection is realized. The spring member 211 has a free end 209 which resiliently contacts a respective conductive circuit 207 having solder 205 partially disposed thereon. The RF shield 109 is assembled to the printed circuit board 115 at room temperature. The conductive circuit 207 is connected to and effectively maintained at an electrical ground potential coupled to the chassis of the radiotelephone.

It is important to note open side 213 on the side of the RF shield 109 between the screwed down ends of the RF shield. In providing RF shielding in applications of this sort, careful and effective grounding is required to prevent any substantial RF leakage currents from escaping the interior of the RF shield 109 by way of bypassing an ineffective ground connection and thereby disrupt or at least degrades substantially communicates quality and circuit operation. A plurality of spring members may be disposed along the open side 213 of the RF shield 109 thereby containing substantial RF leakage currents. The open side 213, in this case, provides for a plurality of spring members wherein each spring member has an effective ground contact to the printed circuit board and ensures that RF leakage currents will be adequately contained and quality operation of the radiotelephone thereby maintained. Such effective shielding is provided and maintained all without the need of heated soldering.

Alternatively, the RF shield may be used to shield a circuit or component from a remote RF emitting device as well as contain RF emissions from an RF emitting device.

Figure 3A:
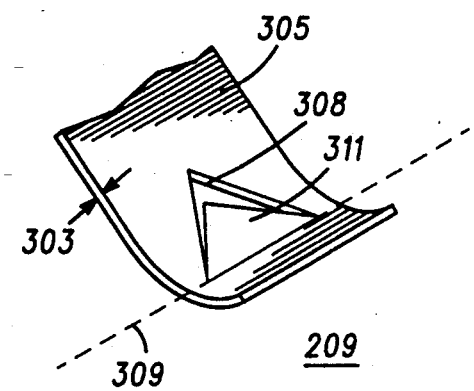
FIGS. 3A and 3B illustrate a top and bottom magnified perspective view of the free end of a spring member which is attached to an RF shield.
Figure 3B:
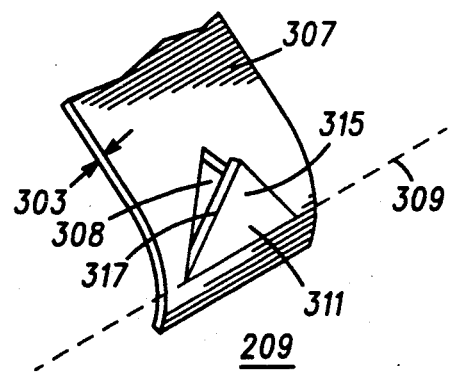

Referring now to FIGS. 3A and 3B there is shown in magnified perspective view of both sides of the free end 209 of the spring member 211. The free end of the spring member has a predetermined thickness 303 disposed between a first top surface 305 and a second bottom surface 307. The top surface 305 is essentially parallel and opposite to the bottom surface 307. A fold line 309, essentially perpendicular to the length of the spring member. The free end 209 has a cut 308 extending from the top surface 305 through to the bottom surface 307 and intersects the fold line 309 in at least two places. The cut 308 is disposed between the fold line 309 and an end of the spring member attached to the RF shield. In the preferred embodiment the perimeter formed by the cut 308 and the fold line yields a triangular shaped portion 311. The bottom surface of the triangular portion 315 is angularly displaced from the bottom surface of the free end 209 about the fold line 309. The angular displacement of the triangular portion 311 exposes an edge 317 of the triangular portion 311 formed by the intersection of the predetermined thickness of the free end 303 and the bottom surface of the triangular portion 315.

The preferred embodiment of the present invention utilizes a cut 308 such that a triangular portion is formed and a pointed edge 317 is created. The present invention is not limited to such a configuration but to any configuration resulting in an edge exposed on the bottom of the free end 209 directed towards the RF shield.

An extension of the preferred embodiment may also include forming a plurality of the edges 317 on the bottom surface of the free end 307. Thus, a plurality of ground connections may be realized thereby increasing the likelihood of a reliable ground connection under a wider variety of manufacturing or design circumstances.

Figure 4:
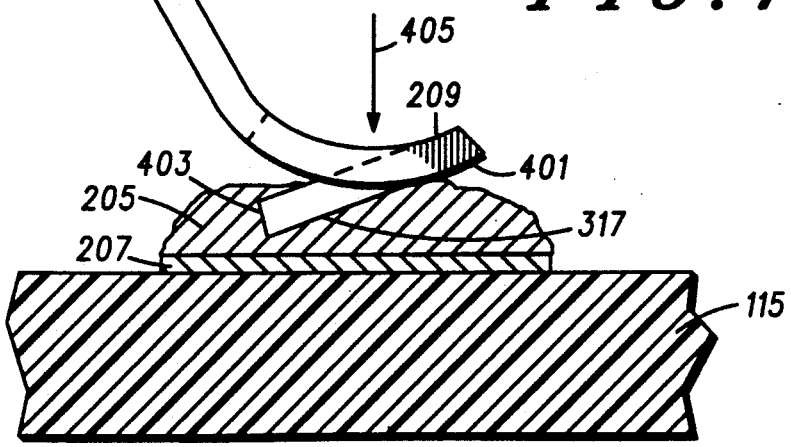
FIG. 4 illustrates a partial side elevation view of a spring member forcing an edge of the free end into solder disposed on a conductive ground circuit.

FIG. 4 shows the edge of the triangular portion 317 advantageously utilized to form a unique and reliable ground connection. FIG. 4 shows a side elevation view of the spring member 211 forcing its free end 209 into the printed circuit board 115 such that the edge of the triangular portion 317 displaces solder 205 on the conductive circuit 207. As the RF shield 109 is screwed into place as shown in FIG. 2, the spring member 211 flexes due to its interference with the printed circuit board 215. When flexed, the spring member 211 creates a normal force 405 driving the free end 209 into the solder 205. A curved portion of the free end 401 guides along the solder 205 until the spring member 211 is substantially flexed to allow the edge 317 to "plow" forward into the solder. The "plowing" forward of the edge 317 into the solder 205 creates an effective and reliable ground connection. An additional advantage of this "plowing" feature is that if the RF shield 109 should loosen somewhat from its fixed position, a forward edge 403 created by a point of the triangular portion "plows" into the solder 205 in a reverse direction reestablishes the ground connection.

In the preferred embodiment of the present invention a malleable conductive medium comprises conventional tin lead solder at least partially disposed on the conductive circuit. Other embodiments may include other malleable conductive mediums such as conductive carbon ink or gold. The spirit of the invention comprises driving the edge formed in the free end of the spring member into a formable medium which is displaced by the force exerted on the edge. The junction of the edge and the displaced conductive medium forms a reliable electrical connection.

The preferred embodiment of the present invention is not limited in scope to only providing a ground connection for the RF shield. The present invention provides an electrical connection between an electrical device and a conductive circuit having a malleable conductive medium disposed thereon. Such applications may include providing an electrical connection between a battery contact external to a housing and a conductive circuit on a printed circuit board located within the housing. Another application may include coupling electrical signals from a transducer to a conductive circuit on a printed circuit board. The advantage of this inventive electrical connection eliminates hand soldering the connection and improves reliability over the aforementioned dimple connection while eliminating the need foe a wired connection from an electrical device and a printed circuit board.

The preferred embodiment of the present invention has therefore disclosed a unique, effective and reliable ground connection between an RF shield and a printed circuit board, without the need for a heated soldering process, advantageously utilized in a radio communication device.

What is claimed is:

1. An electromagnetic shielding apparatus for at least one electronic component, comprising:

a substrate having deformable electrically conductive means;

means, forming a shielding surface, for covering at least a portion of the component, the shielding surface formed thereby being comprised of an electrically conductive, electromagnetic wave-absorbing material for absorbing electromagnetic energy radiated by or towards the component;

means, forming an electrically conductive contact, for providing a protrusion integral to the contact and partially displaced from a plane of the contact at an acute angle to expose and edge; and means, forming an electrically conductive spring member, for coupling the contact and the shielding surface, and for biasing the contact towards the substrate permitting the edge of the protrusion to move in a direction essentially opposite to the direction faced by the exposed edge such that the edge of the protrusion electrically connects with and deforms the conductive means.

2. An electromagnetic shielding apparatus according to claim 1 wherein the substrate includes a substantially planar surface having an electrically conductive circuit disposed thereon, the deformable electrically conductive means further comprises solder disposed on and electrically coupled with the conductive circuit.

3. An electromagnetic shielding apparatus according to claim 1 wherein the protrusion has a triangular shape.

4. An electromagnetic shielding apparatus according to claim 1 wherein the shielding surface and the contact are disposed in different planes, the spring member further comprises an elongated, planar arm integrally formed with the shielding surface and the contact.

5. An electromagnetic shielding apparatus according to claim 1 wherein the electrically-conductive electromagnetic wave-absorbing material comprising the shielding surface absorbs signals of radio frequencies.

6. An electromagnetic shielding apparatus according to claim 1 further comprising means, interconnecting the shielding surface and the substrate, for maintaining the bias force exerted by the spring member.

7. A radiotelephone comprising:
means for transceiving radio frequency (RF) signals including control and RF circuitry;
a substrate having a deformable electrically conductive means;
means, forming a shielding surface, for covering at least a portion of the RF circuitry, the shielding surface formed thereby being comprised of an electrically conductive, electromagnetic wave-absorbing material for absorbing electromagnetic energy radiated by or towards the RF circuitry;
means, forming an electrically conductive contact, for providing a protrusion integral to the contact and partially displaced from a plane of the contact at an acute angle to expose an edge; and
means, forming an electrically conductive spring member, for coupling the contact and the shielding surface, and for biasing the contact towards the substrate permitting the edge of the protrusion to move in a direction essentially opposite to the direction faced by the exposed edge such that the edge of the protrusion electrically connects with and deforms the conductive means.

8. A radiotelephone according to claim 7 wherein the shielding surface and the contact are disposed in different planes, the spring member further comprises an elongated, planar arm integrally formed with the shielding surface and the contact.

9. An electromagnetic shielding apparatus for at least one electronic component, comprising:
a substrate including deformable electrically conductive means having a surface;
means, forming a shielding surface, for covering at least a portion of the component, the shielding surface formed thereby being comprised of an electrically conductive, electromagnetic wave-absorbing material for absorbing electromagnetic energy radiated by or towards the component;
means, forming an electrically conductive contact, for providing a protrusion with an edge; and
means, forming an electrically conductive spring member, for coupling the contact and the shielding surface, and for biasing the contact towards the substrate permitting the edge of the protrusion to extend substantially beyond the surface of the deformable electrically conductive means causing at least partial displacement thereof and electrical connection therebetween.

* * * * *